United States Patent
Zhang et al.

(10) Patent No.: US 12,490,632 B2
(45) Date of Patent: Dec. 2, 2025

(54) FOLDABLE DISPLAY DEVICE AND FABRICATING METHOD THEREOF

(71) Applicants: Chengdu BOE Optoelectronics Technology Co., Ltd., Sichuan (CN); BOE Technology Group Co., Ltd., Beijing (CN)

(72) Inventors: Yi Zhang, Beijing (CN); Wei Gong, Beijing (CN); Wei Chen, Beijing (CN); Xiaodong Hao, Beijing (CN); Xiangdong Wei, Beijing (CN); Danyang Bi, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 169 days.

(21) Appl. No.: 17/802,755

(22) PCT Filed: Nov. 2, 2021

(86) PCT No.: PCT/CN2021/128100
§ 371 (c)(1),
(2) Date: Aug. 26, 2022

(87) PCT Pub. No.: WO2022/179162
PCT Pub. Date: Sep. 1, 2022

(65) Prior Publication Data
US 2024/0206281 A1    Jun. 20, 2024

(30) Foreign Application Priority Data
Feb. 23, 2021    (CN) .......................... 202110202142.6

(51) Int. Cl.
*H10K 59/80*    (2023.01)
*H10K 59/12*    (2023.01)
(Continued)

(52) U.S. Cl.
CPC ....... *H10K 59/871* (2023.02); *H10K 59/1201* (2023.02); *H10K 59/8791* (2023.02); *H10K 77/111* (2023.02); H10K 2102/311 (2023.02)

(58) Field of Classification Search
CPC ............. H10K 59/871; H10K 59/1201; H10K 59/8791; H10K 77/111; H10K 2102/311; Y02E 10/549; G09F 9/301
See application file for complete search history.

(56) References Cited

U.S. PATENT DOCUMENTS

| 11,126,289 B2 * | 9/2021 | Li ......................... H10K 77/111 |
| 2019/0148679 A1 * | 5/2019 | Li ........................... G09F 9/301 |
| | | 345/173 |

(Continued)

FOREIGN PATENT DOCUMENTS

| CN | 109461382 A | 3/2019 |
| CN | 210627726 U | 5/2020 |

(Continued)

OTHER PUBLICATIONS

Machine translation of CN-113744630 (Year: 2021).*
CN 202110202142.6 first office action.

*Primary Examiner* — J.E. Schoenholtz
(74) *Attorney, Agent, or Firm* — IPro, PLLC

(57) ABSTRACT

The foldable display device is provided with a display panel, a first adhering layer and a supporting layer, the first adhering layer includes a first adhering part and a second adhering part, the first adhering part is disposed on one side of the second adhering part. The one side of the second adhering part is away from the bending region, and an elasticity modulus of the second adhering part is greater than an elasticity modulus of the first adhering part. The elasticity modulus of the second adhering part, which is close to the bending region, is set to be greater than the elasticity modulus of the first adhering part, which is away from the (Continued)

bending region. When the foldable display device is in the folding state, the supporting layer may appear staggered floor in the direction opposite to the bending region of the display panel to a larger extent.

8 Claims, 3 Drawing Sheets

(51) Int. Cl.
  *H10K 77/10* (2023.01)
  *H10K 102/00* (2023.01)

(56) References Cited

U.S. PATENT DOCUMENTS

| | | | | |
|---|---|---|---|---|
| 2020/0150481 | A1* | 5/2020 | You | H10K 77/111 |
| 2020/0185641 | A1* | 6/2020 | Jeong | H10K 50/84 |
| 2021/0150944 | A1* | 5/2021 | Yoon | H04M 1/0216 |
| 2021/0157431 | A1 | 5/2021 | Gu et al. | |
| 2021/0183840 | A1 | 6/2021 | Wang | |
| 2022/0050543 | A1 | 2/2022 | Luo | |
| 2022/0093013 | A1 | 3/2022 | Zhang et al. | |
| 2022/0302410 | A1* | 9/2022 | Shi | G09F 9/30 |
| 2022/0308624 | A1 | 9/2022 | Gu | |
| 2023/0096985 | A1* | 3/2023 | Chen | B32B 27/36 |
| | | | | 257/40 |
| 2023/0240119 | A1* | 7/2023 | Lv | G06F 1/1652 |
| 2024/0029592 | A1* | 1/2024 | Wu | G06F 1/1641 |

FOREIGN PATENT DOCUMENTS

| | | | |
|---|---|---|---|
| CN | 111292621 | A | 6/2020 |
| CN | 111816082 | A | 10/2020 |
| CN | 111986578 | A | 11/2020 |
| CN | 212061687 | U | 12/2020 |
| CN | 112991945 | A | 6/2021 |
| CN | 113744630 | A * | 12/2021 |
| IN | 110890025 | A | 3/2020 |

* cited by examiner

FOLDABLE DISPLAY DEVICE AND FABRICATING METHOD THEREOF

The present application claims the priority of the Chinese patent application filed on Feb. 23, 2021 before the Chinese Patent Office with the application number of 202110202142.6 and the title of "FOLDABLE DISPLAY DEVICE AND FABRICATING METHOD THEREOF", which is incorporated herein in its entirety by reference.

TECHNICAL FIELD

The present application relates to the technical field of displaying and, more particularly, to a foldable display device and a fabricating method thereof.

BACKGROUND

With the continuous development of the technique of flexible displaying, foldable display devices have been paid extensive attention. Foldable display devices, because of their advantages that they can increase the display area and that they can be conveniently folded, stored and transported, have become a hot research direction at present.

SUMMARY

Some embodiments of the present application provide the following technical solutions:

In the first aspect, there is provided a foldable display device, wherein the foldable display device includes:
a display panel, wherein the display panel includes a display region, a bonding region and a bending region, wherein the bending region is located between the display region and the bonding region;
a first adhering layer disposed on one side of the display panel, wherein the one side of the display panel is away from a light exiting side of the display panel; and
a supporting layer disposed on one side of the first adhering layer, wherein the one side of the first adhering layer is away from the display panel;
wherein orthographic projections of the supporting layer and the first adhering layer on the display panel are located within the display region; and
the first adhering layer includes a first adhering part and a second adhering part, the first adhering part is disposed on one side of the second adhering part, wherein the one side of the second adhering part is away from the bending region, and an elasticity modulus of the second adhering part is greater than an elasticity modulus of the first adhering part.

Optionally, the elasticity modulus of the second adhering part is greater than or equal to 200 KPa, and the elasticity modulus of the first adhering part is less than or equal to 100 KPa.

Optionally, a material of the first adhering layer is an optically transparent adhesive, and the material of the first adhering part and the material of the second adhering part are doped by different additives.

Optionally, the foldable display device has a folding region, and the folding region is located within a region where the first adhering part is located.

Optionally, the supporting layer has a plurality of hollowed-out parts within the folding region.

Optionally, the foldable display device further includes: a polarizer, a second adhering layer and a cover plate, wherein the polarizer, the second adhering layer and the cover plate are sequentially arranged in layer configuration on the light exiting side of the display panel, and the polarizer, the second adhering layer and the cover plate are sequentially away from the display panel.

Optionally, the bonding region is located on an opposite side of the light exiting side of the display panel;
the display panel includes a panel body, a first back film and a second back film;
the panel body is distributed at the display region, the bonding region and the bending region;
the first back film is located within the display region, and is located between the panel body and the first adhering layer; and
the second back film is located within the bonding region, and is located on one side of the panel body, wherein the one side of the panel body faces the supporting layer.

Optionally, the foldable display device further includes a padding part and a protecting layer;
the padding part is located within the bonding region, and is located between the second back film and the supporting layer; and
the protecting layer is located within the bending region, and is located on one side of the display panel, wherein one side of the display panel is away from the first adhering layer.

In the second aspect, there is provided a method for fabricating a foldable display device, wherein the method includes:
providing a display panel, wherein the display panel includes a display region, a bonding region and a bending region, wherein the bending region is located between the display region and the bonding region;
forming a first adhering layer on one side of the display panel, wherein the one side of the display panel is away from a light exiting side of the display panel; and
forming a supporting layer on one side of the first adhering layer, wherein the one side of the first adhering layer is away from the display panel;
wherein orthographic projections of the supporting layer and the first adhering layer on the display panel are located within the display region; and
the first adhering layer includes a first adhering part and a second adhering part, the first adhering part is disposed on one side of the second adhering part, wherein the one side of the second adhering part is away from the bending region, and an elasticity modulus of the second adhering part is greater than an elasticity modulus of the first adhering part.

Optionally, after the step of providing the display panel, the method further includes:
forming a polarizer on the light exiting side of the display panel; and
adhering the polarizer and the cover plate by using the second adhering layer.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art can obtain other figures according to these figures without paying creative work.

DETAILED DESCRIPTION

In order to make the above purposes, features and advantages of the present application more apparent and understandable, the present application will be described in further detail below with reference to the drawings and the particular embodiments.

Figure 1:
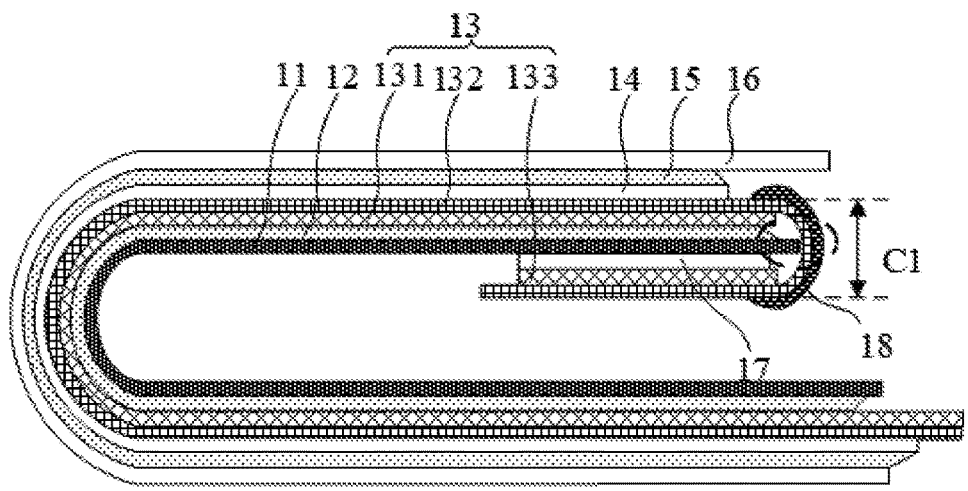
FIG. 1 shows a schematic structural diagram of a foldable display device in the related art.

In the related art, as shown in FIG. 1, a foldable display device includes a supporting layer 11, a first adhering layer 12, a display panel 13, a polarizer 14, a second adhering layer 15, a cover plate 16, a padding part 17 and a protecting layer 18. The display panel 13 includes a panel body 132, a first back film 131 and a second back film 133, the first back film 131 of the display panel 13 is adhesively bonded to the supporting layer 11 by the first adhering layer 12, and the elasticity moduli of the regions of the first adhering layer 12 are equal.

Therefore, when the foldable display device is being folded, the film layers of the foldable display device may appear staggered floor phenomenon therebetween, and therefore the supporting layer 11 may also appear staggered floor outwardly with respect to the display panel 13. Furthermore, because the elasticity moduli of the regions of the first adhering layer 12 are equal, after the supporting layer 11 appears staggered floor outwardly with respect to the display panel 13, the staggered floor amounts at the edges of the two sides of the supporting layer 11 are approximately equal; in other words, the staggered floor amount of the supporting layer 11 in the direction facing the bending region C1 of the display panel 13 and the staggered floor amount of the supporting layer 11 in the direction away from the bending region C1 of the display panel 13 are substantially equal. At this point, the staggered floor amount of the supporting layer 11 in the direction facing the bending region C1 of the display panel 13 is higher, which results in that the bending region C1 of the display panel 13 might easily be pushed and damaged by the supporting layer 11.

In order to prevent the supporting layer 11 from pushing and damaging the bending region C1 of the display panel 13 due to the edge staggered floor, in the related art, the supporting layer 11 is designed to be away from the bending region C1 of the display panel 13; in other words, the distance between the edge of the supporting layer 11 and the bending region C1 of the display panel 13 is increased. However, although such a mode prevents the risk of pushing and damaging the bending region C1, a too large distance between the edge of the supporting layer 11 and the bending region C1 of the display panel 13 causes insufficient support to the bending region C1 by the supporting layer 11, which affects the bending morphology of the bending region C1, which in turn results in problems such as abnormal displaying.

Therefore, in the embodiments of the present application, regarding the first adhering layer adhesively bonded to the display panel and the supporting layer, the elasticity modulus of the second adhering part, which is close to the bending region, is set to be greater than the elasticity modulus of the first adhering part, which is away from the bending region. When the foldable display device is in the folding state, the supporting layer appears staggered floor in the direction away from the bending region of the display panel to a larger extent, so that the staggered floor amount of the supporting layer in the direction facing the bending region of the display panel is lower, thereby preventing the risk that the bending region of the display panel is pushed and damaged by the supporting layer. Furthermore, that can ensure that the supporting layer provides a sufficient bearing force to the bending region of the display panel, which ensures the bending morphology of the bending region, to prevent abnormal displaying.

Figure 2:
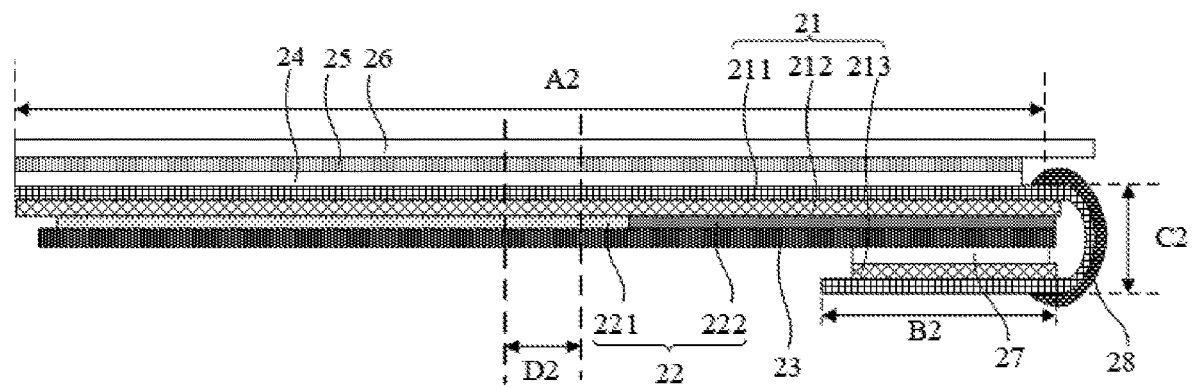
FIG. 2 shows a schematic structural diagram of the foldable display device in a deploying state according to an embodiment of the present application.
Figure 3:
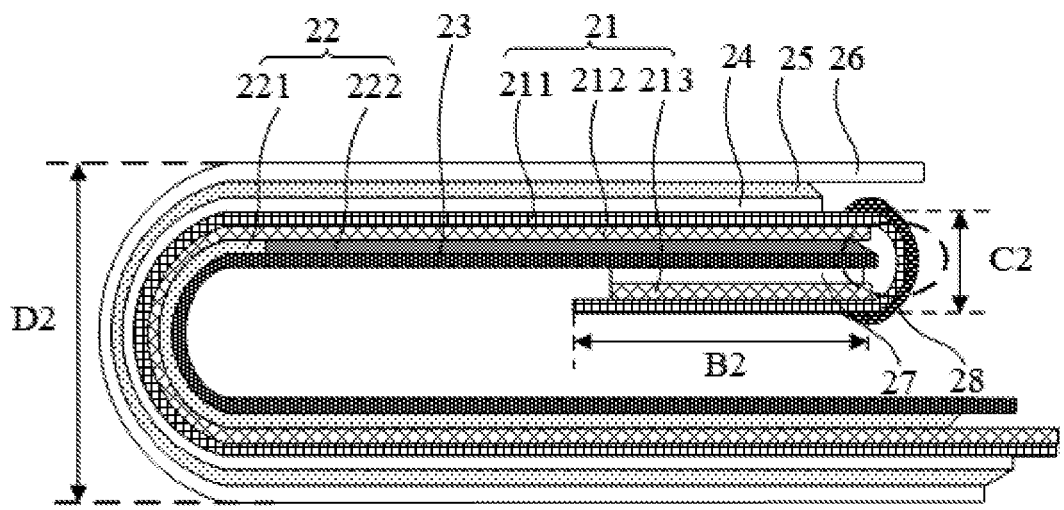
FIG. 3 shows a schematic structural diagram of the foldable display device in a folding state according to an embodiment of the present application.

Referring to FIG. 2, FIG. 2 shows a schematic structural diagram of the foldable display device according to an embodiment of the present application in a deploying state, and FIG. 3 shows a schematic structural diagram of the foldable display device according to an embodiment of the present application in a folding state.

An embodiment of the present application provides a foldable display device, wherein the foldable display device includes: a display panel 21, wherein the display panel 21 includes a display region A2, a bonding region B2 and a bending region C2 (i.e., a Pad Bending region), wherein the bending region C2 is located between the display region A2 and the bonding region B2. The foldable display device further includes: a first adhering layer 22 disposed away from the light exiting side of the display panel 21, and a supporting layer 23 disposed on the side of the first adhering layer 22 away from the display panel 21. The orthographic projections of the supporting layer 23 and the first adhering layer 22 on the display panel 21 are located within the display region A2. The first adhering layer 22 includes a first adhering part 221 and a second adhering part 222, the first adhering part 221 is disposed on the side of the second adhering part 222 away from the bending region C2, and the elasticity modulus of the second adhering part 222 is greater than the elasticity modulus of the first adhering part 221.

In the practical product, the display panel 21, according to the functions of the regions, is delimited into the display region A2, the bonding region B2 and the bending region C2. The bending region C2 is located between the display region A2 and the bonding region B2. The display region A2 refers to the region for displaying the frames of the display panel 21. The bonding region B2 refers to the region for bonding the display panel 21 and the driving chip. Since when the display panel 21 and the driving chip are being bonded, it is required to bond the driving chip to the opposite side of the light exiting side of the display panel 21. Therefore, it is required to bend the display panel 21, wherein the region that is bent is the bending region C2. The surface of the bending region C2 of the display panel 21 is an arc surface.

The first adhering layer 22 is disposed on the opposite side of the light exiting side of the display panel 21. The supporting layer 23 is disposed on the side of the first adhering layer 22, wherein the side of the first adhering layer 22 is away from the display panel 21. The first adhering layer 22 is used to adhesively bond the supporting layer 23 and the display panel 21. The supporting layer 23 is used to support the display panel 21, and ensures the bending morphology of the bending region C2. Furthermore, before the display panel 21 and the driving chip have been bonded, or, in other words, when the bonding region B2 of the display panel 21 has not been bent by using the bending region C2 to the side of the display panel 21 away from the light exiting side, the orthographic projections of the supporting layer 23 and the first adhering layer 22 on the display panel 21 are located within the display region A2; in other words, the supporting layer 23 and the first adhering layer 22 are disposed merely within the display region A2 of the foldable display device, and the supporting layer 23 and the first adhering layer 22 are not disposed within the bonding region B2 and the bending region C2 of the foldable display device.

Moreover, the part of the first adhering layer 22 that is away from the bending region C2 is referred to as the first adhering part 221, and the part of the first adhering layer 22 that is close to the bending region C2 is referred to as the second adhering part 222. Furthermore, the elasticity modulus of the second adhering part 222 is set to be greater than the elasticity modulus of the first adhering part 221.

Therefore, when the foldable display device is in the folding state, because the elasticity modulus of the second adhering part 222 is greater than the elasticity modulus of the first adhering part 221, the supporting layer 23 may appear staggered floor in the direction opposite to the bending region C2 of the display panel 21 to a larger extent; in other words, the staggered floor amount of the supporting layer 23 in the direction facing the bending region C2 of the display panel 21 is less than the staggered floor amount of the supporting layer 23 in the direction opposite to the bending region C2 of the display panel 21, so that the staggered floor amount of the supporting layer 23 in the direction facing the bending region C2 of the display panel 21 is lower, thereby preventing the risk that the bending region C2 of the display panel 21 is pushed and damaged by the supporting layer.

Particularly, the elasticity modulus of the second adhering part 222 is greater than or equal to 200 KPa, and the elasticity modulus of the first adhering part 221 is less than or equal to 100 KPa.

For example, the elasticity modulus of the second adhering part 222 may be set to be 240 KPa, 300 KPa and so on, and the elasticity modulus of the first adhering part 221 may be set to be 60 KPa, 80 KPa and so on, whereby the elasticity modulus of the second adhering part 222 is greater than the elasticity modulus of the first adhering part 221.

Moreover, in the foldable display device, when the bonding region B2 of the display panel 21 has not been bent by using the bending region C2 to the side of the display panel 21 away from the light exiting side, in the direction from the display region A2 pointing to the bending region C2, the length of the first adhering part 221 may be greater than the length of the second adhering part 222. Certainly, the length of the first adhering part 221 may also be less than the length of the second adhering part 222, which is not limited in the embodiments of the present application. Moreover, in the direction perpendicular to the direction that the display region A2 points to the bending region C2, the width of the first adhering part 221 is equal to the width of the second adhering part 222, in which case the direction perpendicular to the direction that the display region A2 points to the bending region C2 is parallel to the light-exiting face of the display panel 21.

In the practical product, the material of the first adhering layer 22 is an optically transparent adhesive, and the material of the first adhering part 221 and the material of the second adhering part 222 are doped by different additives.

In other words, the optically transparent adhesive is actually an OCA (Optically Clear Adhesive) glue, the material of the first adhering part 221 is the OCA glue doped by a first additive, the material of the second adhering part 222 is the OCA glue doped by a second additive, and the first additive and the second additive are different, whereby the elasticity moduli of the two sides of the first adhering layer 22 are different.

In the fabrication of the first adhering layer 22, the OCA glues at the region where the first adhering part 221 is located and at the region where the second adhering part 222 is located are doped by the different additives, whereby the elasticity modulus of the second adhering part 222 is greater than the elasticity modulus of the first adhering part 221. Therefore, when, subsequently, the first adhering layer 22 is being adhered to the opposite side of the light exiting side of the display panel 21, it is merely required to employ the original adhering process, and the process does not require any alteration.

Figure 4:
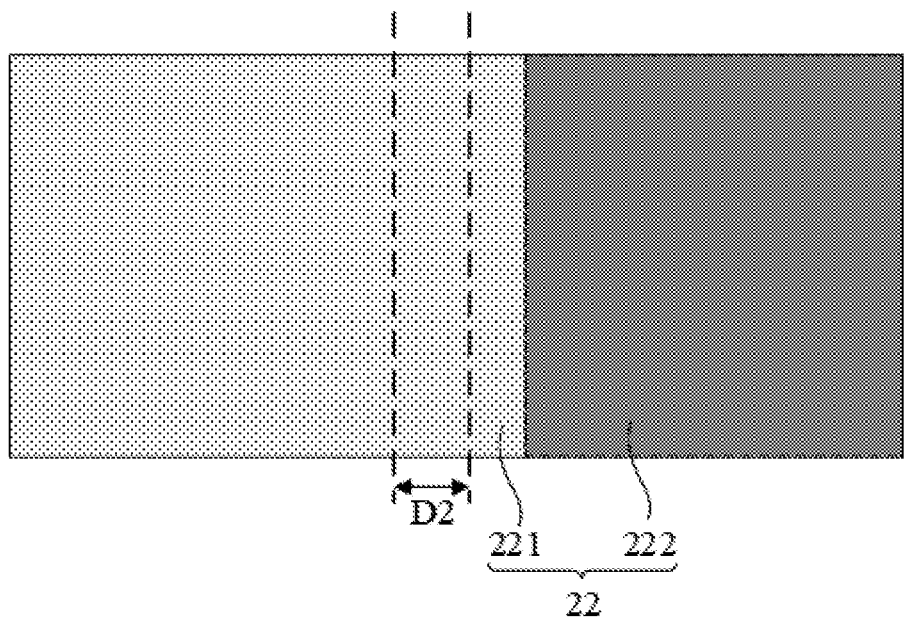
FIG. 4 shows a planar structural diagram of the first adhering layer according to an embodiment of the present application.

In an embodiment of the present application, as shown in FIGS. 2 to 4, the foldable display device has a folding region D2, and the folding region D2 is located within the region where the first adhering part 221 is located.

The folding region D2 refers to the region that is required to be folded when the foldable display device is being changed between the deploying state and the folding state. When the foldable display device is in the deploying state, the light-exiting face of the display panel 21 of the foldable display device is located in the same plane. When the foldable display device is in the folding state, the light-exiting faces of the display panels 21 on the two sides of the folding region D2 are opposite.

By disposing the folding region D2 within the region where the first adhering part 221 is located, because the first adhering part 221 has a lower elasticity modulus, when the foldable display device is being folded, it can be operated more easily. In addition, the supporting layer 23 can be deviated toward the side opposite to the bending region C2 to a larger extent.

In an embodiment of the present application, the supporting layer 23 has a plurality of hollowed-out parts within the folding region D2.

The material of the supporting layer 23 is a rigid material, for example, SUS (stainless steel). Since when the foldable display device is being folded, the supporting layer 23 is also required to be folded, and the material of the supporting layer 23 has a higher rigidity, in order to ensure that the supporting layer 23 can also be folded, it is required to configure the supporting layer 23 within the folding region D2 to have a plurality of hollowed-out parts. The hollowed-out parts extend throughout the supporting layer 23 in the thickness direction of the supporting layer 23, wherein the thickness direction refers to the direction perpendicular to the light-exiting face of the display panel 21. Moreover, in the non-folding area of the supporting layer 23, the supporting layer 23 does not have a hollowed-out part.

Furthermore, the shape of the orthographic projection of the hollowed-out part on the display region A2 of the display panel 21 is a closed pattern, for example a circle, a rectangle and a hexagon and so on. The particular quantity and the mode of distribution of the hollowed-out parts within the folding region D2 are not limited in the embodiments of the present application.

As shown in FIGS. 2 and 3, the foldable display device further includes: a polarizer 24, a second adhering layer 25 and a cover plate 26 that are sequentially arranged in layer configuration on the light exiting side of the display panel, and the polarizer 24, the second adhering layer 25 and the cover plate 26 are sequentially away from the display panel 21.

In other words, the polarizer 24 is disposed on the light-exiting face of the display panel 21, the second adhering layer 25 is disposed on the side of the polarizer 24 away from the display panel 21, and the cover plate 26 is disposed on the side of the second adhering layer 25 away from the polarizer 24.

Furthermore, the polarizer 24 and the second adhering layer 25 are located within the display region A2 of the display panel 21. The material of the second adhering layer 25 is an OCA glue. The elasticity moduli of the regions of the second adhering layer 25 are equal. The elasticity modulus of the second adhering layer 25 may be equal to the elasticity modulus of the first adhering part 221. The cover plate 26 is not only located within the display region A2, but also extends to the bending region C2.

In an embodiment of the present application, the bonding region B2 is located on the opposite side of the light exiting side of the display panel 21. The display panel 21 includes a panel body 211, a first back film 212 and a second back film 213. The panel body 211 is distributed at the display region A2, the bonding region B2 and the bending region C2. The first back film 212 is located within the display region A2, and is located between the panel body 211 and the first adhering layer 22. The second back film 213 is located within the bonding region B2, and is located on the side of the panel body 211 facing the supporting layer 23.

In the practical fabrication process, after the display panel 21, the polarizer 24, the second adhering layer 25, the cover plate 26, the first adhering layer 22 and the supporting layer 23 have been assembled, it is required to, within the bonding region B2 of the display panel 21, bond the display panel 21 and the driving chip together, and then, by bending the bending region C2, fix the driving chip on the opposite side of the light exiting side of the display panel 21. At this point, the bonding region B2 is bent to the side of the display panel 21 opposite to the light exiting side.

The display panel 21 includes the panel body 211. The panel body 211 is an OLED (Organic Light Emitting Diode) panel. The panel body 211 includes a substrate base plate, a pixel driving circuit disposed on the substrate base plate, a light emitting device connected to the pixel driving circuit and a packaging layer covering the light emitting device. The substrate base plate is a flexible base plate. The panel body 211 is distributed at the display region A2, the bonding region B2 and the bending region C2.

Moreover, the display panel 21 further includes the first back film 212 and the second back film 213, wherein the first back film 212 and the second back film 213 are disposed on the side of the substrate base plate away from the light emitting device. The first back film 212 is located within the display region A2, and is located between the panel body 211 and the first adhering layer 22. The second back film 213 is located within the bonding region B2. After the bonding region B2 has been bent by using the bending region C2 to the side of the display panel 21 away from the light exiting side, the second back film 213 is located on the side of the panel body 211 facing the supporting layer 23. Moreover, the bending region C2 is not provided with a back film; in other words, the first back film 212 and the second back film 213 have a separating region therebetween.

By disposing the first back film 212 and the second back film 213 in the display panel 21, the first back film 212 and the second back film 213 can protect the panel body 211.

In an embodiment of the present application, the foldable display device further includes a padding part 27 and a protecting layer 28. The padding part 27 is located within the bonding region B2, and is located between the second back film 213 and the supporting layer 23. The protecting layer 28 is located within the bending region C2, and is located on the side of the display panel 21 away from the first adhering layer 22.

The padding part 27 is disposed within the bonding region B2 of the display panel 21. The padding part 27 is located on the side of the second back film 213 away from the panel body 211. Therefore, after the bonding region B2 has been bent by using the bending region C2 to the side of the display panel 21 away from the light exiting side, the padding part 27 is located between the second back film 213 and the supporting layer 23.

The protecting layer 28 is disposed within the bending region C2 of the display panel 21. After the bonding region B2 has been bent by using the bending region C2 to the side of the display panel 21 opposite to the light exiting side, the protecting layer 28 is located on the side of the display panel 21 away from the first adhering layer 22. Moreover, the protecting layer 28 may partially extend to the display region A2 and the bonding region B2.

Particularly, the protecting layer 28 is actually an MCL (Metal Cover Layer) adhesive layer. By disposing the protecting layer 28 within the bending region C2, the position of the neutral stress layer of the foldable display device can be located at the display panel 21, wherein the neutral stress layer refers to the position that bears the minimum stress after the bending region C2 of the display panel 21 has been bent. Therefore, by disposing the protecting layer 28, the probability of damaging of the display panel 21 can be effectively reduced, and the protecting layer 28 can protect the metal traces within the bending region C2.

It should be noted that the foldable display device according to the embodiments of the present application is an outwardly folded display device. In other words, when the foldable display device is in the folding state, both of the light-exiting faces of the display panel 21 are exposed to the external.

In practical applications, the foldable display device may be any products or components that have the functions of display and folding, such as an electronic paper, a mobile phone, a tablet personal computer, a display, a notebook computer and a navigator and so on.

In an embodiment of the present application, regarding the first adhering layer adhesively bonded to the display panel and the supporting layer, the elasticity modulus of the second adhering part, which is close to the bending region, is set to be greater than the elasticity modulus of the first adhering part, which is away from the bending region. When the foldable display device is in the folding state, the supporting layer may appear staggered floor in the direction away from the 30) bending region of the display panel to a larger extent, so that the staggered floor amount of the supporting layer in the direction facing the bending region of the display panel is lower, thereby preventing the risk that the bending region of the display panel is pushed and damaged by the supporting layer.

Figure 5:
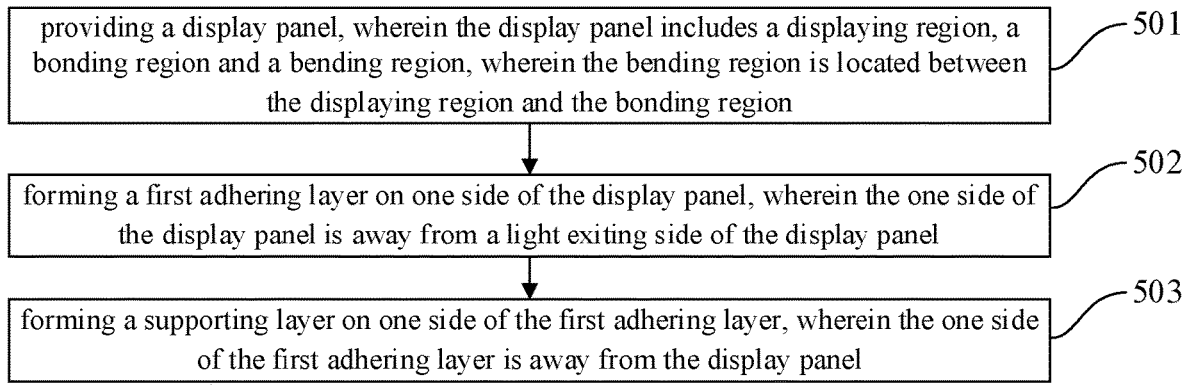
FIG. 5 shows a flow chart of the method for fabricating a foldable display device according to an embodiment of the present application.

Referring to FIG. 5, FIG. 5 shows a flow chart of the method for fabricating a foldable display device according to an embodiment of the present application. The method may particularly include the following steps:

Step 501: providing a display panel, wherein the display panel includes a display region, a bonding region and a bending region, wherein the bending region is located between the display region and the bonding region.

In an embodiment of the present application, firstly, the display panel 21 is fabricated, wherein the display panel 21 includes the panel body 211, the first back film 212 and the second back film 213.

Particularly, firstly the pixel driving circuit is formed on the substrate base plate, subsequently the light emitting device connected to the pixel driving circuit is formed, and subsequently the packaging layer covering the light emitting device is formed, to obtain the panel body 211, wherein the panel body 211 is distributed at the display region A2, the bonding region B2 and the bending region C2. Finally, the first back film 212 and the second back film 213 are formed on the opposite side of the light exiting side of the panel body 211, wherein the first back film 212 is located within the display region A2, and the second back film 213 is located within the bonding region B2.

Step 502: forming a first adhering layer on one side of the display panel, wherein the one side of the display panel is away from a light exiting side of the display panel.

In an embodiment of the present application, after the display panel 21 has been formed, the first adhering layer 22 is formed on the side of the display panel 21, wherein the side of the display panel 21 is away from the light exiting side. Particularly, the first adhering layer 22 is formed on the side of the display panel 21 opposite to the light exiting side by using a pasting process.

The orthographic projection of the first adhering layer 22 on the display panel 21 is located within the display region A2. The first adhering layer 22 includes a first adhering part 221 and a second adhering part 222, the first adhering part 221 is disposed on the side of the second adhering part 222 away from the bending region C2, and the elasticity modulus of the second adhering part 222 is greater than the elasticity modulus of the first adhering part 221.

Moreover, after the step 501, the method further includes: forming a polarizer on the light exiting side of the display panel; and
   adhering the polarizer and the cover plate by using the second adhering layer.

In other words, after the display panel 21 has been formed, the polarizer 24 is pasted onto the light exiting side of the display panel 21, and subsequently the polarizer 24 and the cover plate 26 are adhesively bonded together by using the second adhering layer 25. Particularly, the process may include firstly forming the second adhering layer 25 on the polarizer 24, and subsequently adhesively bonding the cover plate 26 and the polarizer 24 formed with the second adhering layer 25 together. The process may also include firstly forming the second adhering layer 25 on the cover plate 26, and subsequently adhesively bonding the cover plate 26 formed with the second adhering layer 25 and the polarizer 24 together.

It should be noted that, after the display panel 21 has been fabricated, the process may include firstly sequentially forming the polarizer 24, the second adhering layer 25 and the cover plate 26, and subsequently forming the first adhering layer 22. Certainly, the fabricating sequence according to the embodiments of the present application is not limited to the above-described sequence.

Step 503: forming a supporting layer on one side of the first adhering layer, wherein the one side of the first adhering layer is away from the display panel.

In an embodiment of the present application, after the first adhering layer 22 has been formed on the side of the display panel 21 away from the light exiting side, the supporting layer 23 is formed on the side of the first adhering layer 22 away from the display panel 21, wherein the orthographic projection of the supporting layer 23 on the display panel 21 is located within the display region A2.

After the supporting layer 23 has been formed on the side of the first adhering layer 22 away from the display panel 21, within the bonding region B2 of the display panel 21, the display panel 21 and the driving chip are bonded together. Subsequently, by bending the bending region C2, the driving chip is fixed on the opposite side of the light exiting side of the display panel 21.

It should be noted that, after the second back film 213 has been formed, the padding part 27 may be formed on the side of the second back film 213 away from the panel body 211. When, subsequently, the display panel 21 and the driving chip are bonded and the driving chip is fixed on the opposite side of the light exiting side of the display panel 21 by using the bending region C2, the padding part 27 is located between the second back film 213 and the supporting layer 23. Moreover, the protecting layer 28 may, before the bending region C2 of the display panel 21 is bent, be formed within the bending region C2 of the display panel 21.

In an embodiment of the present application, regarding the first adhering layer adhesively bonded to the display panel and the supporting layer, the elasticity modulus of the second adhering part, which is close to the bending region, is set to be greater than the elasticity modulus of the first adhering part, which is away from the bending region. When the foldable display device is in the folding state, the supporting layer may appear staggered floor in the direction opposite to the bending region of the display panel to a larger extent, so that the staggered floor amount of the supporting layer in the direction facing the bending region of the display panel is lower, thereby preventing the risk that the bending region of the display panel is pushed and damaged by the supporting layer.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A foldable display device, wherein the foldable display device comprises:
   a display panel, wherein the display panel comprises a display region, a bonding region and a bending region, wherein the bending region is located between the display region and the bonding region;
   a first adhering layer disposed on one side of the display panel, wherein the one side of the display panel is away from a light exiting side of the display panel; and
   a supporting layer disposed on one side of the first adhering layer, wherein the one side of the first adhering layer is away from the display panel;
   wherein orthographic projections of the supporting layer and the first adhering layer on the display panel are located within the display region; and
   the first adhering layer comprises a first adhering part and a second adhering part, the first adhering part is disposed on one side of the second adhering part, wherein the one side of the second adhering part is away from the bending region, and an elasticity modulus of the second adhering part is greater than an elasticity modulus of the first adhering part;
   wherein the bonding region is located on an opposite side of the light exiting side of the display panel;
   the display panel comprises a panel body, a first back film and a second back film;
   the panel body is distributed at the display region, the bonding region and the bending region;
   the first back film is located within the display region, and is located between the panel body and the first adhering layer; and
   the second back film is located within the bonding region, and is located on one side of the panel body, wherein the one side of the panel body faces the supporting layer.

2. The foldable display device according to claim 1, wherein the foldable display device further comprises: a polarizer, a second adhering layer and a cover plate, wherein the polarizer, the second adhering layer and the cover plate are sequentially arranged in layer configuration on the light exiting side of the display panel, and the polarizer, the second adhering layer and the cover plate are sequentially away from the display panel.

3. The foldable display device according to claim 1, wherein the foldable display device further comprises a padding part and a protecting layer;
   the padding part is located within the bonding region, and is located between the second back film and the supporting layer; and
   the protecting layer is located within the bending region, and is located on one side of the display panel, wherein one side of the display panel is away from the first adhering layer.

4. A method for fabricating the foldable display device according to claim 1, wherein the method comprises:
   providing the display panel;
   forming the first adhering layer on the one side of the display panel that is away from a light exiting side of the display panel; and
   forming the supporting layer on the one side of the first adhering layer that is away from the display panel.

5. The method according to claim 4, wherein after the step of providing the display panel, the method further comprises:
   forming a polarizer on the light exiting side of the display panel; and
   adhering the polarizer and the cover plate by using the second adhering layer.

6. A foldable display device, wherein the foldable display device comprises:
   a display panel, wherein the display panel comprises a display region, a bonding region and a bending region, wherein the bending region is located between the display region and the bonding region;
   a first adhering layer disposed on one side of the display panel, wherein the one side of the display panel is away from a light exiting side of the display panel; and
   a supporting layer disposed on one side of the first adhering layer, wherein the one side of the first adhering layer is away from the display panel;
   wherein orthographic projections of the supporting layer and the first adhering layer on the display panel are located within the display region; and
   the first adhering layer comprises a first adhering part and a second adhering part, the first adhering part is disposed on one side of the second adhering part, wherein the one side of the second adhering part is away from the bending region, and an elasticity modulus of the second adhering part is greater than an elasticity modulus of the first adhering part;
   wherein the elasticity modulus of the second adhering part is greater than or equal to 200 KPa, and the elasticity modulus of the first adhering part is less than or equal to 100 KPa;
   wherein the bonding region is located on an opposite side of the light exiting side of the display panel;
   the display panel comprises a panel body, a first back film and a second back film;
   the panel body is distributed at the display region, the bonding region and the bending region;
   the first back film is located within the display region, and is located between the panel body and the first adhering layer; and
   the second back film is located within the bonding region, and is located on one side of the panel body, wherein the one side of the panel body faces the supporting layer.

7. A foldable display device, wherein the foldable display device comprises:
   a display panel, wherein the display panel comprises a display region, a bonding region and a bending region, wherein the bending region is located between the display region and the bonding region;
   a first adhering layer disposed on one side of the display panel, wherein the one side of the display panel is away from a light exiting side of the display panel; and a supporting layer disposed on one side of the first adhering layer, wherein the one side of the first adhering layer is away from the display panel;

wherein orthographic projections of the supporting layer and the first adhering layer on the display panel are located within the display region; and the first adhering layer comprises a first adhering part and a second adhering part, the first adhering part is disposed on one side of the second adhering part, wherein the one side of the second adhering part is away from the bending region, and an elasticity modulus of the second adhering part is greater than an elasticity modulus of the first adhering part;

wherein the foldable display device has a folding region, and the folding region is located within a region where the first adhering part is located;

wherein the bonding region is located on an opposite side of the light exiting side of the display panel;

the display panel comprises a panel body, a first back film and a second back film;

the panel body is distributed at the display region, the bonding region and the bending region;

the first back film is located within the display region, and is located between the panel body and the first adhering layer; and the second back film is located within the bonding region, and is located on one side of the panel body, wherein the one side of the panel body faces the supporting layer.

8. The foldable display device according to claim 7, wherein the supporting layer has a plurality of hollowed-out parts within the folding region.

* * * * *